(12) United States Patent
Jung et al.

(10) Patent No.: US 10,395,708 B2
(45) Date of Patent: Aug. 27, 2019

(54) ELECTRONIC DEVICE

(71) Applicant: SK hynix Inc., Icheon-si (KR)

(72) Inventors: Ku-Youl Jung, Seoul (KR); Jong-Koo Lim, Icheon-si (KR); Yang-Kon Kim, Icheon-si (KR); Jae-Hyoung Lee, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 0 days.

(21) Appl. No.: 16/055,624

(22) Filed: Aug. 6, 2018

(65) Prior Publication Data

US 2019/0074041 A1    Mar. 7, 2019

(30) Foreign Application Priority Data

Sep. 7, 2017 (KR) .......................... 10-2017-0114542

(51) Int. Cl.
*H01L 29/82* (2006.01)
*G11C 11/16* (2006.01)
*H01L 43/10* (2006.01)
*H01L 27/12* (2006.01)
*H01L 43/08* (2006.01)
*H01L 43/02* (2006.01)

(52) U.S. Cl.
CPC ........ *G11C 11/161* (2013.01); *H01L 27/1222* (2013.01); *H01L 43/02* (2013.01); *H01L 43/08* (2013.01); *H01L 43/10* (2013.01)

(58) Field of Classification Search
CPC ....................................................... H01L 27/222
USPC ........................................................... 257/421
See application file for complete search history.

(56) References Cited

U.S. PATENT DOCUMENTS

2015/0129996 A1\* 5/2015 Tang ..................... H01L 43/12
257/427
2017/0170388 A1\* 6/2017 Whig ..................... H01L 43/02
2017/0338021 A1\* 11/2017 Xiao ........................ H01F 10/30

FOREIGN PATENT DOCUMENTS

KR    10-2013-0071400    6/2013
KR    10-2015-0068294    6/2015
KR    10-2016-0122915    10/2016

\* cited by examiner

*Primary Examiner* — Ajay Arora
(74) *Attorney, Agent, or Firm* — Perkins Coie LLP

(57) ABSTRACT

An electronic device may include a semiconductor memory, and the semiconductor memory may include a free layer having a variable magnetization direction; a pinned layer having a fixed magnetization direction; and a tunnel barrier layer interposed between the free layer and the pinned layer, wherein the free layer may include: a first sublayer having a damping constant of 0.1 or less; a second sublayer having a perpendicular magnetic anisotropy energy density ranging from $1.0 \times 10^4$ to $1.0 \times 10^8$ erg/cm$^3$; and an insertion layer interposed between the first sublayer and the second sublayer.

20 Claims, 6 Drawing Sheets

ELECTRONIC DEVICE

CROSS-REFERENCE TO RELATED APPLICATION

This patent document claims priority of Korean Patent Application No. 10-2017-0114542, entitled "ELECTRONIC DEVICE" and filed on Sep. 7, 2017, which is incorporated herein by reference in its entirety.

TECHNICAL FIELD

This patent document relates to memory circuits or devices and their applications in electronic devices or systems.

BACKGROUND

Recently, as electronic devices or appliances trend toward miniaturization, low power consumption, high performance, multi-functionality, and so on, there is a demand for electronic devices capable of storing information in various electronic devices or appliances such as a computer, a portable communication device, and so on, and research and development for such electronic devices have been conducted. Examples of such electronic devices include electronic devices which can store data using a characteristic switched between different resistant states according to an applied voltage or current, and can be implemented in various configurations, for example, an RRAM (resistive random access memory), a PRAM (phase change random access memory), an FRAM (ferroelectric random access memory), an MRAM (magnetic random access memory), an E-fuse, etc.

SUMMARY

The disclosed technology in this patent document includes memory circuits or devices and their applications in electronic devices or systems and various implementations of an electronic device, in which an electronic device includes a semiconductor memory which can improve characteristics of a variable resistance element.

In one aspect, an electronic device may include a semiconductor memory, and the semiconductor memory may include a free layer having a variable magnetization direction; a pinned layer having a fixed magnetization direction; and a tunnel barrier layer interposed between the free layer and the pinned layer, wherein the free layer may include: a first sublayer having a damping constant of 0.1 or less; a second sublayer having a perpendicular magnetic anisotropy energy density ranging from $1.0 \times 10^4$ to $1.0 \times 10^8$ erg/cm$^3$; and an insertion layer interposed between the first sublayer and the second sublayer.

Implementations of the above electronic device may include one or more the following.

The second sublayer may be disposed closer to the tunnel barrier layer than the first sublayer is. The first sublayer may include a Heusler alloy, a half-Heusler alloy, or a half-metal, or a combination thereof. The insertion layer may include a material blocking crystallinity that is transferred from a layer disposed below the insertion layer. The insertion layer may include Zr, Hf, V, Cr, Cu, Nb, Mo, Ru, Rh, Ta, W, Re or Ir, or a combination thereof. The second sublayer may include an alloy or a stack structure, which includes Co, Fe or B, or a combination thereof. The second sublayer may include a Co—Fe—B alloy or a Co—Fe—B—X alloy (where X may be Mn, Cu, Al, Si, Ti, V, Cr, Ni, Ga, Ge, Zr, Nb, Mo, Pd, Ag, Hf, Ta, W or Pt). The first sublayer may have a damping constant ranging from 0.001 to 0.1.

The electronic device may further include a microprocessor which includes: a control unit configured to receive a signal including a command from an outside of the microprocessor, and performs extracting, decoding of the command, or controlling input or output of a signal of the microprocessor; an operation unit configured to perform an operation based on a result that the control unit decodes the command; and a memory unit configured to store data for performing the operation, data corresponding to a result of performing the operation, or an address of data for which the operation is performed, wherein the semiconductor memory is part of the memory unit in the microprocessor.

The electronic device may further include a processor which includes: a core unit configured to perform, based on a command inputted from an outside of the processor, an operation corresponding to the command, by using data; a cache memory unit configured to store data for performing the operation, data corresponding to a result of performing the operation, or an address of data for which the operation is performed; and a bus interface connected between the core unit and the cache memory unit, and configured to transmit data between the core unit and the cache memory unit, wherein the semiconductor memory is part of the cache memory unit in the processor.

The electronic device may further include a processing system which includes: a processor configured to decode a command received by the processor and control an operation for information based on a result of decoding the command; an auxiliary memory device configured to store a program for decoding the command and the information; a main memory device configured to call and store the program and the information from the auxiliary memory device such that the processor can perform the operation using the program and the information when executing the program; and an interface device configured to perform communication between at least one of the processor, the auxiliary memory device and the main memory device and the outside, wherein the semiconductor memory is part of the auxiliary memory device or the main memory device in the processing system.

The electronic device may further include a data storage system which includes: a storage device configured to store data and conserve stored data regardless of power supply; a controller configured to control input and output of data to and from the storage device according to a command inputted from an outside; a temporary storage device configured to temporarily store data exchanged between the storage device and the outside; and an interface configured to perform communication between at least one of the storage device, the controller and the temporary storage device and the outside, wherein the semiconductor memory is part of the storage device or the temporary storage device in the data storage system.

The electronic device may further include a memory system which includes: a memory configured to store data and conserve stored data regardless of power supply; a memory controller configured to control input and output of data to and from the memory according to a command inputted from an outside; a buffer memory configured to buffer data exchanged between the memory and the outside; and an interface configured to perform communication between at least one of the memory, the memory controller and the buffer memory and the outside, wherein the semiconductor memory is part of the memory or the buffer memory in the memory system.

In another aspect, an electronic device including a semiconductor memory, wherein the semiconductor memory may include a variable resistance element, wherein the variable resistance element may include: a free layer having a variable magnetization direction; a pinned layer having a fixed magnetization direction; and a tunnel barrier layer interposed between the free layer and the pinned layer, wherein the free layer may include: a first sublayer including a Heusler alloy, a half-Heusler alloy, or a half-metal, or a combination thereof; a second sublayer including an alloy or a stack structure which includes Co, Fe or B, or a combination thereof; and an insertion layer interposed between the first sublayer and the second sublayer.

Implementations of the above electronic device may include one or more the following.

The first sublayer may be structured to decrease a damping constant of the free layer. The second sublayer may be structured to maintain a perpendicular magnetic anisotropy energy density of the free layer at a high level. The insertion layer may include a material blocking crystallinity that is transferred from a layer disposed below the insertion layer. The insertion layer may include Zr, Hf, V, Cr, Cu, Nb, Mo, Ru, Rh, Ta, W, Re or Ir, or a combination thereof. The second sublayer may include a Co—Fe—B alloy or a Co—Fe—B—X alloy (where, X may be Mn, Cu, Al, Si, Ti, V, Cr, Ni, Ga, Ge, Zr, Nb, Mo, Pd, Ag, Hf, Ta, W or Pt). The first sublayer may have a damping constant ranging from 0.001 to 0.1.

These and other aspects, implementations and associated advantages are described in greater detail in the drawings, the description and the claims.

DETAILED DESCRIPTION

Figure 1:
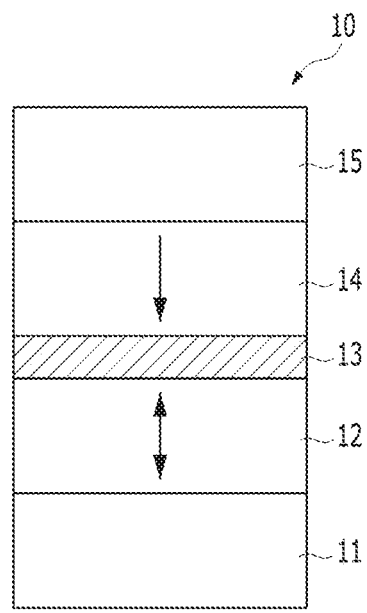
FIG. 1 is a cross-sectional view illustrating a variable resistance element having a free layer with a single-layer structure.

Various examples and implementations of the disclosed technology are described below in detail with reference to the accompanying drawings.

The drawings may not be necessarily to scale and in some instances, proportions of at least some of substrates in the drawings may have been exaggerated in order to clearly illustrate certain features of the described examples or implementations. In presenting a specific example in a drawing or description having two or more layers in a multi-layer substrate, the relative positioning relationship of such layers or the sequence of arranging the layers as shown reflects a particular implementation for the described or illustrated example and a different relative positioning relationship or sequence of arranging the layers may be possible.

Prior to explaining implementations of the present disclosure, a variable resistance element in accordance with a comparative example will be explained.

FIG. 1 is a cross-sectional view illustrating a variable resistance element having a free layer with a single-layer structure.

Referring to FIG. 1, a variable resistance element 10 may include a Magnetic Tunnel Junction (MTJ) structure which includes a free layer 12 having a variable magnetization direction, a pinned layer 14 having a fixed magnetization direction and a tunnel barrier layer 13 interposed between the free layer 12 and the pinned layer 14.

The resistance in the electrical path across the MTJ structure exhibits a variable resistance with different resistance values depending on the relative direction between the magnetization directions of the free layer 12 and the pinned layer 14 on two sides of the tunnel barrier layer 13. The free layer 12 is structured to exhibit a variable magnetization direction that can be changed to produce different magnetization states for the MTJ structure and may also be referred to as a storage layer.

The pinned layer 14 is structured to exhibit a fixed magnetization direction and may also be referred to as a reference layer. The free layer 12 and the pinned layer 14 may have a single-layer structure or a multi-layer structure that includes magnetic materials. The tunnel barrier layer 13 is interposed between the free layer 12 and the pinned layer 14 to allow the tunneling of electrons in both data reading and data writing operations. The tunnel barrier layer 13 may include an insulating oxide. The resistance in the electrical path across the MTJ structure exhibits a variable resistance with different resistance values depending on the relative direction between the magnetization directions of the free layer 12 and the pinned layer 14 on two sides of the tunnel barrier layer 13. Accordingly, the magnetization direction of the free layer 12 can be controlled to set the MTJ structure to exhibit different resistance values for storing different digital data. The change in the magnetization direction of the free layer 12 may be induced by spin transfer torque via a spin-polarized current that is directed to flow through the tunnel barrier layer 13 via the electron tunneling. In a read operation, a small read current is directed through the MTJ structure that does not change the magnetization direction of the free layer 12 to enable readout the resistance value of the MTJ structure at a given magnetization direction of the free layer 12. In a write operation, a sufficiently large spin-polarized write current is directed through the MTJ structure to produce a sufficiently high spin transfer torque to change the existing magnetization direction of the free layer 12, thus writing a new magnetization state in the MTJ structure.

In some implementations such as the example shown, the variable resistance element 10 may further include one or more additional layers to improve characteristics of the MTJ structure. For example, the variable resistance element 10 may further include an under layer 11 disposed below the MTJ structure, or an upper layer 15 disposed over the MTJ structure, or others.

To provide a high density memory device including the variable resistance element 10, the variable resistance element 10 can be designed to reduce a switching current that can change a magnetization direction of the free layer 12. This is because the size of each memory cell containing the variable resistance element 10 is dependent on the size of a transistor within the cell for supplying the switching current and the size of the transistor can be reduced when the switching current is reduced (e.g., due to the reduced need for heat dissipation). In this regard, the switching current is proportional to a damping constant α of the free layer 12 so that the damping constant α of the free layer 12 may be lowered in order to reduce the switching current, achieving the high-density of the variable resistance element 10. Accordingly, as the damping constant α of the free layer 12 becomes lower, the magnetization direction of the free layer 12 can be easily changed with a smaller current, thereby improving characteristics of the variable resistance element 10. However, there are limitations to reduction of the damping constant of the free layer. This is because, if the free layer 12 is formed of or includes a material having a low damping constant, the perpendicular magnetic anisotropy at an interface between the free layer 12 and the tunnel barrier layer 13 may be decreased to cause deterioration of the characteristics of the variable resistance element 10. Therefore, in designing the variable resistance element 10, on one hand, there is a need to reduce the switching current for reducing the size of the variable resistance element 10 for a high density memory chip but, on the other hand, there is a need not to reduce the damping constant to a low level that would adversely affect the perpendicular magnetic anisotropy. The disclosed technology in this document balances the above two competing needs achieve a high density memory chip with desired reliable memory operation performance.

In accordance with an implementation of the disclosed technology, a semiconductor memory and its fabricating method are provided to achieve desired characteristics of the variable resistance element, for example, by including a free layer having a multi-layer structure which is capable of maintaining a high perpendicular magnetic anisotropy energy density (Ku) value while significantly decreasing a damping constant and thus, lowering a switching current.

Figure 2:
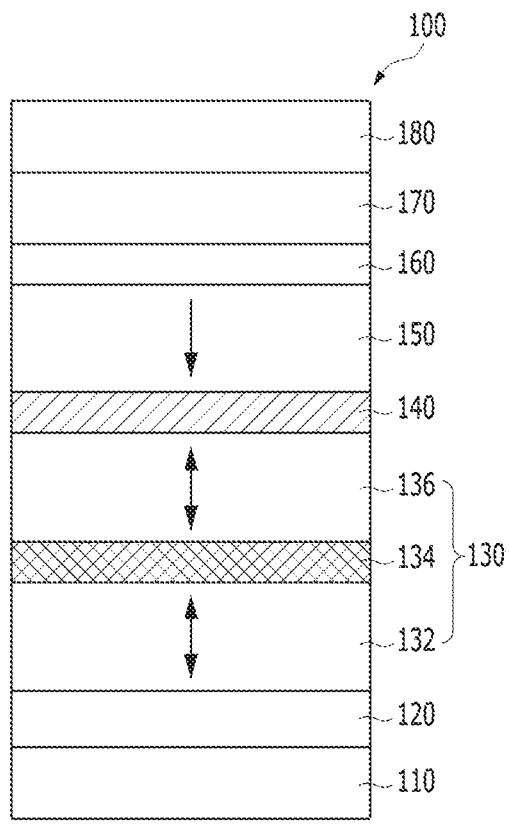
FIG. 2 is a cross-sectional view illustrating an exemplary variable resistance element in accordance with an implementation of the disclosed technology.

FIG. 2 is a cross-sectional view illustrating an exemplary variable resistance element in accordance with an implementation of the disclosed technology.

Referring to FIG. 2, a variable resistance element 100 may include a magnetic tunnel junction (MTJ) structure which includes a free layer 130, a pinned layer 150 and a tunnel barrier layer 140.

The free layer 130, the pinned layer 150, and the tunnel barrier layer 140 collectively form part of an MTJ structure exhibiting variable resistance values for storing different data bits as explained above. The free layer 130 has a variable magnetization direction, the pinned layer 150 has a fixed magnetization direction, and the tunnel barrier layer 140 is interposed between the free layer 130 and the pinned layer 150 to allow the tunneling of electrons in both data reading and data writing operations.

The free layer 130 may have a variable magnetization direction that changes between different directions to cause the MTJ structure to have a variable resistance value. With the change of the magnetization direction of the free layer 130, the relative relationship of the magnetization directions of the free layer 130 and the pinned layer 150 also changes, which allows the variable resistance element 100 to store different data or represent different data bits. The free layer 130 may also be referred as a storage layer or the like. The magnetization direction of the free layer 130 may be substantially perpendicular to a surface of the free layer 130, the tunnel barrier layer 140 and the pinned layer 150. In other words, the magnetization direction of the free layer 130 may be substantially parallel to the stacking directions of the free layer 130, the tunnel barrier layer 140 and the pinned layer 150. Therefore, the magnetization direction of the free layer 130 may be changed between a downward direction and an upward direction. The change in the magnetization direction of the free layer 130 may be induced by spin transfer torque.

The free layer 130 may have a multi-layer structure.

In an implementation, the free layer 130 may include a first sublayer 132, an insertion layer 134 and a second sublayer 136. The first sublayer 132 is disposed far from the tunnel barrier layer 140 and the second sublayer 136 is disposed adjacent to the tunnel barrier layer 140. The second sublayer 136 is disposed closer to the tunnel barrier layer 140 than the first sublayer 132 is. In some implementations, the second sublayer 136, the insertion layer 134, and the first sublayer 132 are disposed in order along a downward direction.

The first sublayer 132 may include a material having a low damping constant α. In an implementation, the first sublayer 132 may have a low damping constant α of 0.1 or less. In another implementation, the first sublayer 132 may have a low damping constant α ranging from 0.001 to 0.1. When the first sublayer 132 has a low damping constant α of 0.1 or less, a magnetization direction of the free layer 12 can be easily changed with a smaller current, thereby improving characteristics of the variable resistance element 100.

The first sublayer 132 may include a Heusler alloy, a half-Heusler alloy, or a half-metal, or a combination thereof.

The Heusler alloy or the half-Heusler alloy is a magnetic intermetallic with a face-centered cubic crystal structure. The Heusler alloy may have a composition of $X_2YZ$ and the half-Heusler alloy may have a composition of $XYZ$, where X and Y are transition metals and Z is in the p-block. The Heusler alloy or the half-Heusler alloy may exhibit properties that are associated with the intrinsic spin of electrons in addition to electronic charge, which are referred to as spintronics. The examples of the properties relevant to spintronics may include magnetoresistance, variations of the Hall effect, ferromagnetism, antiferromagnetism, ferrimagnetism, halfmetallicity, semimetallicity, semiconductivity with spin filter ability, superconductivity, or topological insulation. The magnetism of the Heusler alloy or the half-Heusler alloy may result from a double-exchange mechanism between neighboring magnetic ions.

Examples of the Heusler alloy may include $Cu_2MnAl$, $Cu_2MnIn$, $Cu_2MnSn$, $Ni_2MnAl$, $Ni_2MnIn$, $Ni_2MnSn$, $Ni_2MnSb$, $Ni_2MnGa$, $Co_2MnAl$, $Co_2MnSi$, $Co_2MnGa$, $Co_2MnGe$, $Co_2NiGa$, $Pd_2MnAl$, $Pd_2MnIn$, $Pd_2MnSn$, $Pd_2MnSb$, $Co_2FeSi$, $Co_2FeAl$, $Fe_2VAl$, $Mn_2VGa$, or $Co_2FeGe$. The examples of the Heusler alloy are not limited to those above and may include others.

The half-metal may be or include any substance that acts as a conductor to electrons of one spin orientation, but as an insulator or semiconductor to the electrons of the opposite spin orientation. All half-metals are ferromagnetic or ferrimagnetic, and examples of the half-metals may be or include oxides, sulfides, or Heusler alloys.

Examples of the half-metal may include chromium (IV) oxide, magnetite, lanthanum strontium manganite (LSMO), or chromium arsenide, or others.

The first sublayer 132 is formed of or includes a material with a low damping constant α to decrease a switching current, thereby improving characteristics of the variable resistance element 100.

The insertion layer 134 may block crystallinity that can be transferred from the first sublayer 132 to layers disposed over the first sublayer 132.

Therefore, the insertion layer 134 may include a material capable of blocking crystallinity that is transferred from any layer below the insertion layer 134. In an implementation, the insertion layer 134 may include a metal such as Zr, Hf, V, Cr, Cu, Nb, Mo, Ru, Rh, Ta, W, Re, or Ir, or a combination thereof.

The second sublayer 136 may include a material having a high perpendicular magnetic anisotropy energy density (Ku). In an implementation, the second sublayer 136 may have a perpendicular magnetic anisotropy energy density (Ku) ranging from $1.0 \times 10^4$ to $1.0 \times 10^8$ erg/cm$^3$. When the second sublayer 136 has a high perpendicular magnetic anisotropy energy density (Ku) ranging from $1.0 \times 10^4$ to $1.0 \times 10^8$ erg/cm$^3$, it is possible to maintain a sufficiently high perpendicular magnetic anisotropy the free layer 130 in order to exhibit an improved characteristics of the variable resistance element 100.

The second sublayer 136 may include an alloy including Co, Fe or B, for example, a Co—Fe—B alloy, a Co—Fe—B—X alloy (where, X may be Mn, Cu, Al, Si, Ti, V, Cr, Ni, Ga, Ge, Zr, Nb, Mo, Pd, Ag, Hf, Ta, W or Pt), an Fe—Pt alloy, an Fe—Pd alloy, a Co—Pd alloy, a Co—Pt alloy, a Co—Gd alloy, an Fe—Ni—Pt alloy, a Co—Fe—Pt alloy, a Co—Ni—Pt alloy, or a Co—Fe—Pd alloy or others, a stack structure such as Co/Pt, Co/Pd, Co/Ir, or Co/Ru or others, or an alternate stack structure of a magnetic material and a nonmagnetic material.

The second sublayer 136 may serve to maintain perpendicular magnetic anisotropy of the free layer 130 at a high level.

As such, in accordance with the implementation, the first sublayer 132 may be formed of or include a material having a low damping constant, the second sublayer 136 may be formed of or include a material having a high perpendicular magnetic anisotropy energy density (Ku), and the insertion layer 134 capable of blocking crystallinity that is transferred from the layer(s) disposed below the insertion layer 134 may be formed between the first sublayer 132 and the second sublayer 136. By forming the free layer 130 in a multi-layer structure, the free layer 130 can have a damping constant not higher than 0.1 and a high perpendicular magnetic anisotropy between $1.0 \times 10^4$ to $1.0 \times 10^8$ erg/cm$^3$. Since the free layer 130 includes the first sublayer 132 with a damping constant lower than that of the free layer 12 in FIG. 1, a switching current can be decreased as compared to the variable resistance element 10 in FIG. 1. In addition, since the free layer 130 includes the second sublayer 136 with a high perpendicular magnetic anisotropy as compared to the free layer 12 in FIG. 1, it is also possible to overcome a problem caused by using a material for the free layer with a low damping constant, for example, a decrease in a perpendicular magnetic anisotropy energy density (Ku) at an interface between the free layer 130 and the tunnel barrier layer 140. Therefore, the free layer 130 can achieve both effects of reducing a drive current of the variable resistance element 100 and improving perpendicular magnetic anisotropy of the variable resistance element 100.

The tunnel barrier layer 140 may allow the tunneling of electrons in both data reading and data writing operations. In a write operation for storing new data, a high write current may be directed through the tunnel barrier layer 140 to change the magnetization direction of the free layer 130 and thus to change the resistance state of the MTJ for writing a new data bit. In a reading operation, a low reading current may be directed through the tunnel barrier layer 140 without changing the magnetization direction of the free layer 130 to measure the existing resistance state of the MTJ under the existing magnetization direction of the free layer 130 to read the stored data bit in the MTJ. The tunnel barrier layer 140 may include a dielectric oxide, for example, an oxide of a material such as Mg, Al, Ca, Sr, Ti, V, Nb, Y, Zn, or Sn or others, or a mixed oxide thereof.

The pinned layer 150 may have a pinned magnetization direction which contrasts with the magnetization direction of the free layer 130, and may be referred to as a reference layer or the like. In some implementations, the magnetization direction of the pinned layer 150 may be pinned in a downward direction. In some implementations, the magnetization direction of the pinned layer 150 may be pinned in an upward direction.

The pinned layer 150 may have a single-layer or multi-layer structure including a ferromagnetic material. For example, the pinned layer 150 may include an alloy based on Fe, Ni or Co, for example, an Fe—Pt alloy, an Fe—Pd alloy, a Co—Pd alloy, a Co—Pt alloy, an Fe—Ni—Pt alloy, a Co—Fe—Pt alloy, a Co—Ni—Pt alloy, or a Co—Fe—B alloy or others, or may include a stack of metals, such as Co/Pt, or Co/Pd or others.

The magnetization directions of the free layer 130 and the pinned layer 150 may be substantially perpendicular to an interface of the layers, for example, an interface between the free layer 130 and the tunnel barrier layer 140. In some implementation, the variable resistance element 100 may include a perpendicular MTJ structure.

The variable resistance element 100 may store data by switching between different resistance states according to a voltage or current applied to the variable element 100. If a voltage or current is applied to the variable resistance element 100, the magnetization direction of the free layer 130 may be changed by spin torque transfer. When the magnetization directions of the free layer 130 and the pinned layer 150 are parallel to each other, the variable resistance element 100 may be in a low resistance state to store a designated digital data bit such as '0'. Conversely, when the magnetization directions of the free layer 130 and the pinned layer 150 are anti-parallel to each other, the variable resistance element 100 may be in a high resistance state to store a designated digital data bit such as '1'. In some implementations, the variable resistance element 100 can be configured to store data bit '1' when the magnetization directions of the free layer 130 and the pinned layer 150 are parallel to each other and to store data bit '0' when the magnetization directions of the free layer 130 and the pinned layer 150 are anti-parallel to each other.

In some implementations, the variable resistance element 100 may further include one or more layers performing various functions to improve a characteristic of the MTJ structure. For example, the variable resistance element 100 may further include a buffer layer 110, an under layer 120, a spacer layer 160, a magnetic correction layer 170 and a capping layer 180.

The buffer layer 110 may be disposed under the under layer 120 and aid in crystal growth of the under layer 120. When the buffer layer 110 is formed under the under layer 120, it is possible to aid in crystal growth of the under layer 120 and thus improve perpendicular magnetic crystalline anisotropy of the free layer 130'. The buffer layer 110 may have a single-layer or multilayer structure including a metal, a metal alloy, a metal nitride, or a metal oxide, or a combination thereof.

The under layer 120 may be disposed under the free layer 130' and serve to improve perpendicular magnetic crystalline anisotropy of the free layer 130.

The under layer 120 may have a single-layer or multilayer structure including a metal, a metal alloy, a metal nitride, or a metal oxide, or a combination thereof.

The magnetic correction layer 170 may serve to offset the effect of the stray magnetic field produced by the pinned layer 150. In this case, the effect of the stray magnetic field of the pinned layer 150 can decrease, and thus a biased magnetic field in the free layer 130' can decrease. The magnetic correction layer 170 may have a magnetization direction anti-parallel to the magnetization direction of the pinned layer 150. In the implementation, when the pinned layer 150 has a downward magnetization direction, the magnetic correction layer 170 may have an upward magnetization direction. Conversely, when the pinned layer 150 has an upward magnetization direction, the magnetic correction layer 170 may have a downward magnetization direction. The magnetic correction layer 170 may have a single-layer or multilayer structure including a ferromagnetic material.

In this implementation, the magnetic correction layer 170 is located above the pinned layer 150, but the position of the magnetic correction layer 170 may be changed. For example, the magnetic correction layer 170 may also be located above, below, or next to the MTJ structure while it is patterned separately from the MTJ structure.

The spacer layer 160 may be interposed between the magnetic correction layer 170 and the pinned layer 150 and function as a buffer between the magnetic correction layer 170 and the pinned layer 150. The spacer layer 160 may serve to improve characteristics of the magnetic correction layer 170. The spacer layer 160 may include a noble metal such as ruthenium (Ru).

The capping layer 180 may function as a hard mask for patterning the variable resistance element 100. In some implementations, the capping layer 180 may include various conductive materials such as a metal. In some implementations, the capping layer 180 may include a metallic material having almost none or a small number of pin holes and high resistance to wet and/or dry etching. In some implementations, the capping layer 180 may include a metal, a nitride or an oxide, or a combination thereof. For example, the capping layer 180 may include a noble metal such as ruthenium (Ru).

In some implementations, the positions of the free layer 130 and the pinned layer 150 with respect to the tunnel barrier layer 140 may be changed with each other. For example, the free layer 130 may be disposed on the tunnel barrier layer 140 and the pinned layer 150 may be disposed under the tunnel barrier layer 140 and over the buffer layer 110.

A semiconductor memory device as disclosed in this document may include a cell array of variable resistance elements 100 to store data. The semiconductor memory may further include various components such as lines, elements, etc. to drive or control each variable resistance element 100. This is exemplarily explained with reference to FIGS. 3 and 4.

Figure 3:
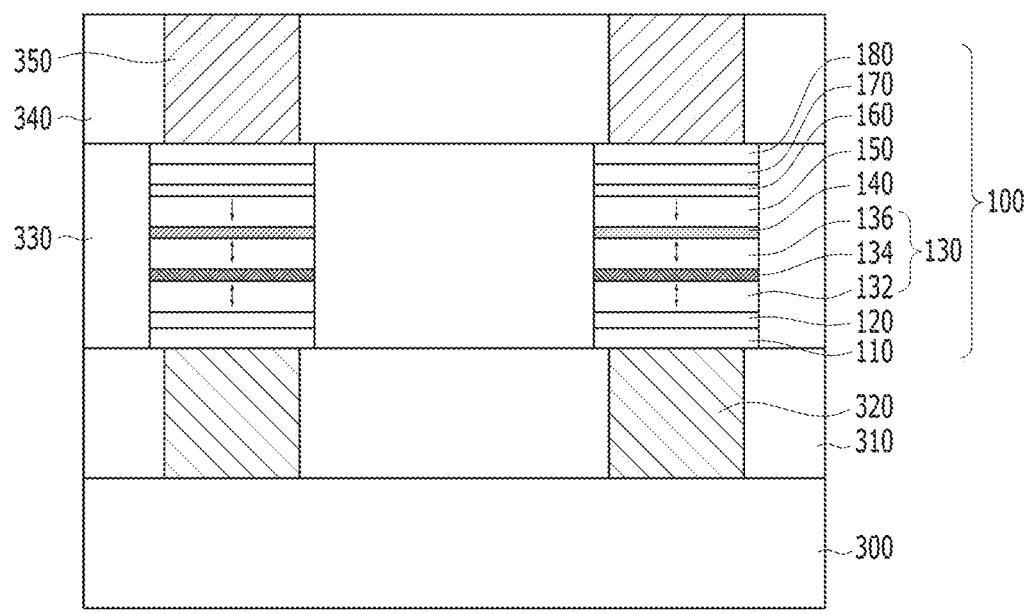
FIG. 3 is a cross-sectional view illustrating an exemplary memory device and a method for fabricating the same in accordance with an implementation of the disclosed technology.

FIG. 3 is a cross-sectional view for explaining a memory device and a method for fabricating the same in accordance with an implementation of the disclosed technology.

Referring to FIG. 3, the memory device of the implementation may include a substrate 300, lower contacts 320 formed over the substrate 300, variable resistance elements 100 formed over the lower contacts 320 and upper contacts 350 formed over the variable resistance element 100. For each variable resistance element 100, a specific structure as a switch or switching circuit/element, for example, a transistor, for controlling an access to a particular variable resistance element 100 can be provided over the substrate 300 to control the variable resistance element 100, where the switch can be turned on to select the variable resistance element 100 or turned off to de-select the variable resistance element 100. The lower contacts 320 may be disposed over the substrate 300, and couple a lower end of the variable resistance element 100 to a portion of the substrate 300, for example, a drain of the transistor as the switching circuit for the variable resistance element 100. The upper contact 350 may be disposed over the variable resistance element 100, and couple an upper end of the variable resistance element 100 to a certain line (not shown), for example, a bit line. In FIG. 3, two variable resistance elements 100 are shown as examples of the elements in an array of variable resistance elements 100.

The above memory device may be fabricated by following processes.

First, the substrate 300 in which the transistor or the like is formed may be provided, and then, a first interlayer dielectric layer 310 may be formed over the substrate 300. Then, the lower contact 320 may be formed by selectively etching the first interlayer dielectric layer 310 to form a hole H exposing a portion of the substrate 300 and filling the hole H with a conductive material. Then, the variable resistance element 100 may be formed by forming material layers for the variable resistance element 100 over the first interlayer dielectric layer 310 and the lower contact 320, and selectively etching the material layers. The etch process for forming the variable resistance element 100 may include the IBE method which has a strong physical etching characteristic. Then, a second interlayer dielectric layer 330 may be formed to cover the variable resistance element. Then, a third interlayer dielectric layer 340 may be formed over the variable resistance element 100 and the second interlayer dielectric layer 330, and then upper contacts 350 passing through the third interlayer dielectric layer 340 and coupled to an upper end of the variable resistance element 100 may be formed.

In the memory device in accordance with this implementation, all layers forming the variable resistance element 100 may have sidewalls which are aligned with one another. That is because the variable resistance element 100 is formed through an etch process using one mask.

Unlike the implementation of FIG. 3, a part of the variable resistance element 100 may be patterned separately from other parts. This process is illustrated in FIG. 4.

Figure 4:
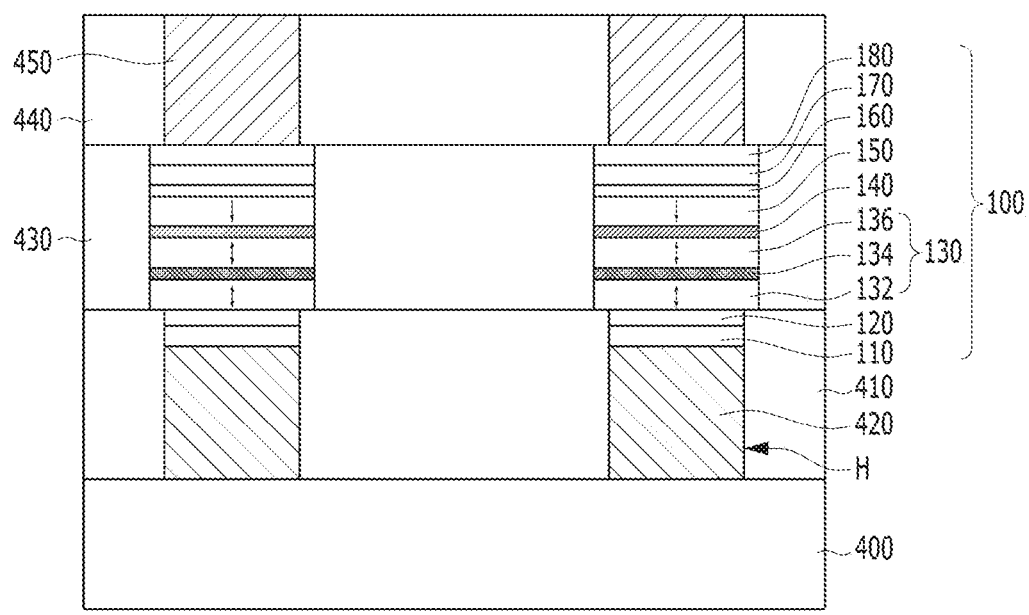
FIG. 4 is a cross-sectional view illustrating another exemplary memory device and a method for fabricating the same in accordance with an implementation of the disclosed technology.

FIG. 4 is a cross-sectional view for explaining a memory device and a method for fabricating the same in accordance with another implementation of the disclosed technology. The following descriptions will be focused on a difference from the implementation of FIG. 3.

Referring to FIG. 4, the memory device in accordance with this implementation may include a variable resistance element 100 of which parts, for example, a buffer layer 110 and a under layer 120, have sidewalls that are not aligned with other layers thereof. As shown in FIG. 4, the buffer layer 110 and the under layer 120 may have sidewalls which are aligned with lower contacts 420.

The memory device in FIG. 4 may be fabricated by following processes.

First, a first interlayer dielectric layer 410 may be formed over a substrate 400, and then selectively etched to form a hole H exposing a portion of the substrate 400. The, the lower contacts 420 may be formed to fill a lower portion of the hole H. For example, the lower contacts 420 may be formed through a series of processes of forming a conductive material to cover the resultant structure having the hole formed therein, and removing a part of the conductive material through an etch back process or the like until the conductive material has a desired thickness. Then, the buffer layer 110 and an under layer 120 may be formed so as to fill the remaining portion the hole H. For example, the buffer layer 110 may be formed by forming a material layer for forming the buffer layer 110 which covers the resultant structure in which the lower contacts 420 is formed, and then removing a portion of the material layer by, for example, an etch-back process until the material layer has a desired thickness. Moreover, the under layer 120 may be formed by forming a material layer for forming the under layer 120 which covers the resultant structure in which the lower contacts 420 and the buffer layer 110 are formed, and then performing a planarization process such as a CMP (Chemical Mechanical Planarization) until a top surface of the first interlayer dielectric layer 410 is exposed. Then, the remaining parts of the variable resistance element 100 may be formed by forming material layers for forming the remaining layers of the variable resistance element 100 except the buffer layer 110 and the under layer 120 over the lower contacts 420 and the first interlayer dielectric layer 410.

Subsequent processes are substantially the same as those as shown in FIG. 3.

In this implementation, the height which needs to be etched at a time in order to form the variable resistance element 100 can be reduced, which makes it possible to lower the difficulty level of the etch process.

Although in this implementation, the buffer layer 110 and the under layer 120 are buried in the hole H, other parts of the variable resistance element 100 may also be buried as needed.

The above and other memory circuits or semiconductor devices based on the disclosed technology can be used in a range of devices or systems. FIGS. 5 to 9 provide some examples of devices or systems that can implement the memory circuits disclosed herein.

Figure 5:
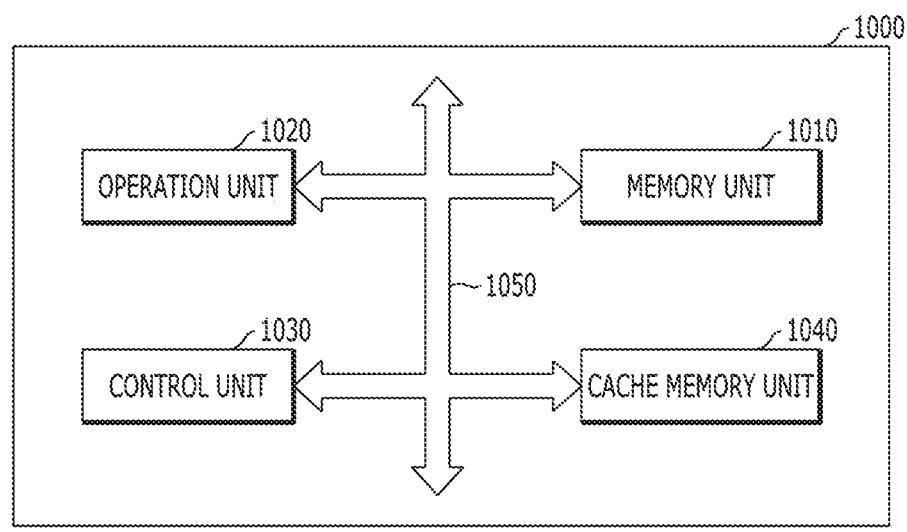
FIG. 5 is an example of configuration diagram of a microprocessor implementing memory circuitry based on an implementation of the disclosed technology.

FIG. 5 is an example of configuration diagram of a microprocessor implementing memory circuitry based on an implementation of the disclosed technology.

Referring to FIG. 5, a microprocessor 1000 may perform tasks for controlling and tuning a series of processes of receiving data from various external devices, processing the data, and outputting processing results to external devices. The microprocessor 1000 may include a memory unit 1010, an operation unit 1020, a control unit 1030, and so on. The microprocessor 1000 may be various data processing units such as a central processing unit (CPU), a graphic processing unit (GPU), a digital signal processor (DSP) and an application processor (AP).

The memory unit 1010 is a part which stores data in the microprocessor 1000, as a processor register, register or the like. The memory unit 1010 may include a data register, an address register, a floating point register and so on. Besides, the memory unit 1010 may include various registers. The memory unit 1010 may perform the function of temporarily storing data for which operations are to be performed by the operation unit 1020, result data of performing the operations and addresses where data for performing of the operations are stored.

The memory unit 1010 may include one or more of the above-described semiconductor devices in accordance with the implementations. For example, the memory unit 1010 may include a free layer having a variable magnetization direction; a pinned layer having a fixed magnetization direction; and a tunnel barrier layer interposed between the free layer and the pinned layer, wherein the free layer may include: a first sublayer having a damping constant of 0.1 or less; a second sublayer having a perpendicular magnetic anisotropy energy density ranging from $1.0 \times 10^4$ to $1.0 \times 10^8$ erg/cm$^3$; and an insertion layer interposed between the first sublayer and the second sublayer. Through this, data storage characteristics of the memory unit 1010 may be improved. As a consequence, operating characteristics of the microprocessor 1000 may be improved.

The operation unit 1020 may perform four arithmetical operations or logical operations according to results that the control unit 1030 decodes commands. The operation unit 1020 may include at least one arithmetic logic unit (ALU) and so on.

The control unit 1030 may receive signals from the memory unit 1010, the operation unit 1020 and an external device of the microprocessor 1000, perform extraction, decoding of commands, and controlling input and output of signals of the microprocessor 1000, and execute processing represented by programs.

The microprocessor 1000 according to this implementation may additionally include a cache memory unit 1040 which can temporarily store data to be inputted from an external device other than the memory unit 1010 or to be outputted to an external device. In this case, the cache memory unit 1040 may exchange data with the memory unit 1010, the operation unit 1020 and the control unit 1030 through a bus interface 1050.

Figure 6:
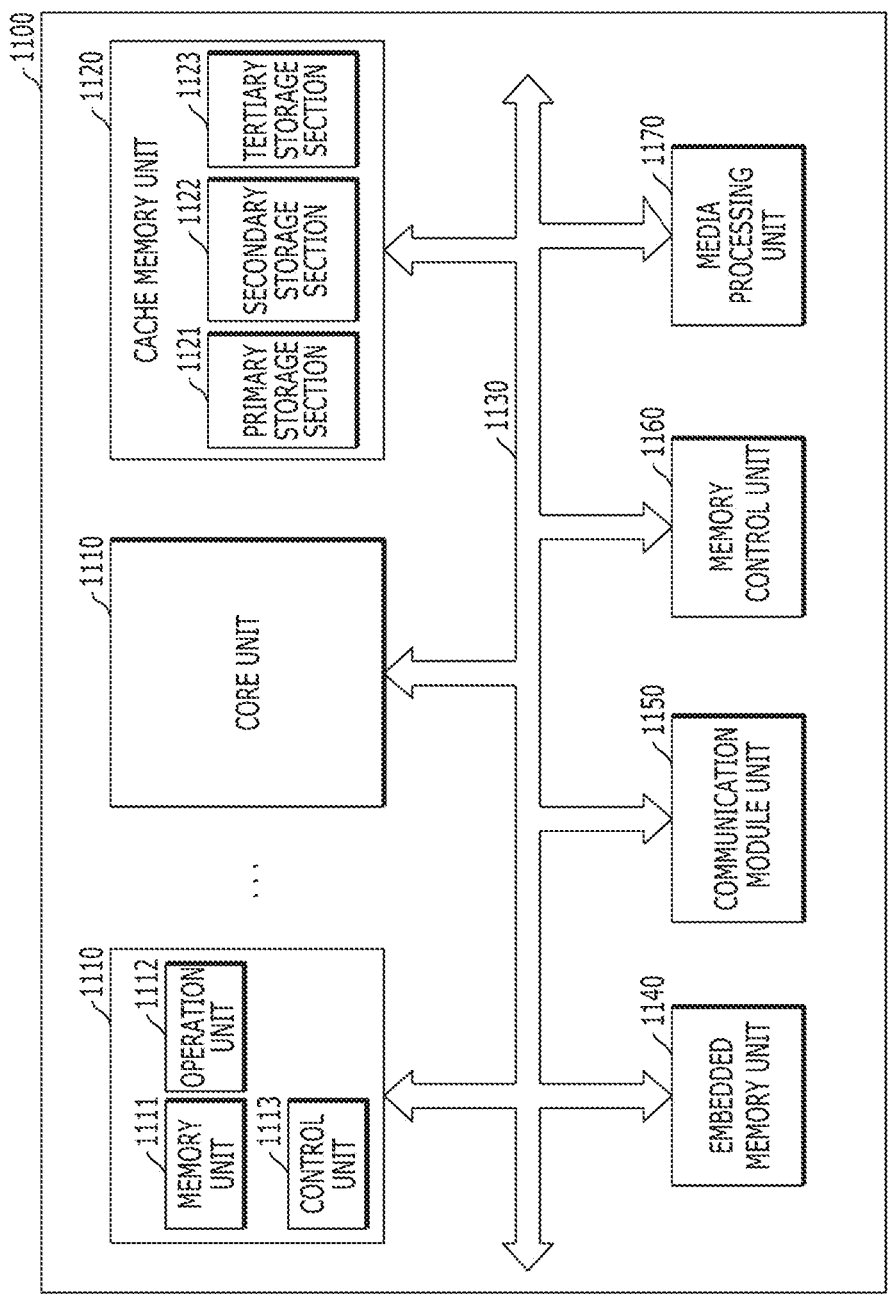
FIG. 6 is an example of configuration diagram of a processor implementing memory circuitry based on an implementation of the disclosed technology.

FIG. 6 is an example of configuration diagram of a processor implementing memory circuitry based on an implementation of the disclosed technology.

Referring to FIG. 6, a processor 1100 may improve performance and realize multi-functionality by including various functions other than those of a microprocessor which performs tasks for controlling and tuning a series of processes of receiving data from various external devices, processing the data, and outputting processing results to external devices. The processor 1100 may include a core unit 1110 which serves as the microprocessor, a cache memory unit 1120 which serves to storing data temporarily, and a bus interface 1130 for transferring data between internal and external devices. The processor 1100 may include various system-on-chips (SoCs) such as a multi-core processor, a graphic processing unit (GPU) and an application processor (AP).

The core unit 1110 of this implementation is a part which performs arithmetic logic operations for data inputted from an external device, and may include a memory unit 1111, an operation unit 1112 and a control unit 1113.

The memory unit 1111 is a part which stores data in the processor 1100, as a processor register, a register or the like.

The memory unit 1111 may include a data register, an address register, a floating point register and so on. Besides, the memory unit 1111 may include various registers. The memory unit 1111 may perform the function of temporarily storing data for which operations are to be performed by the operation unit 1112, result data of performing the operations and addresses where data for performing of the operations are stored. The operation unit 1112 is a part which performs operations in the processor 1100. The operation unit 1112 may perform four arithmetical operations, logical operations, according to results that the control unit 1113 decodes commands, or the like. The operation unit 1112 may include at least one arithmetic logic unit (ALU) and so on. The control unit 1113 may receive signals from the memory unit 1111, the operation unit 1112 and an external device of the processor 1100, perform extraction, decoding of commands, controlling input and output of signals of processor 1100, and execute processing represented by programs.

The cache memory unit 1120 is a part which temporarily stores data to compensate for a difference in data processing speed between the core unit 1110 operating at a high speed and an external device operating at a low speed. The cache memory unit 1120 may include a primary storage section 1121, a secondary storage section 1122 and a tertiary storage section 1123. In general, the cache memory unit 1120 includes the primary and secondary storage sections 1121 and 1122, and may include the tertiary storage section 1123 in the case where high storage capacity is required. As the occasion demands, the cache memory unit 1120 may include an increased number of storage sections. That is to say, the number of storage sections which are included in the cache memory unit 1120 may be changed according to a design. The speeds at which the primary, secondary and tertiary storage sections 1121, 1122 and 1123 store and discriminate data may be the same or different. In the case where the speeds of the respective storage sections 1121, 1122 and 1123 are different, the speed of the primary storage section 1121 may be largest. At least one storage section of the primary storage section 1121, the secondary storage section 1122 and the tertiary storage section 1123 of the cache memory unit 1120 may include one or more of the above-described semiconductor devices in accordance with the implementations. For example, the cache memory unit 1120 may include a free layer having a variable magnetization direction; a pinned layer having a fixed magnetization direction; and a tunnel barrier layer interposed between the free layer and the pinned layer, wherein the free layer may include: a first sublayer having a damping constant of 0.1 or less; a second sublayer having a perpendicular magnetic anisotropy energy density ranging from $1.0 \times 10^4$ to $1.0 \times 10^8$ erg/cm$^3$; and an insertion layer interposed between the first sublayer and the second sublayer. Through this, data storage characteristics of the cache memory unit 1120 may be improved. As a consequence, operating characteristics of the processor 1100 may be improved.

Although it was shown in FIG. 6 that all the primary, secondary and tertiary storage sections 1121, 1122 and 1123 are configured inside the cache memory unit 1120, it is to be noted that all the primary, secondary and tertiary storage sections 1121, 1122 and 1123 of the cache memory unit 1120 may be configured outside the core unit 1110 and may compensate for a difference in data processing speed between the core unit 1110 and the external device. Meanwhile, it is to be noted that the primary storage section 1121 of the cache memory unit 1120 may be disposed inside the core unit 1110 and the secondary storage section 1122 and the tertiary storage section 1123 may be configured outside the core unit 1110 to strengthen the function of compensating for a difference in data processing speed. In another implementation, the primary and secondary storage sections 1121, 1122 may be disposed inside the core units 1110 and tertiary storage sections 1123 may be disposed outside core units 1110.

The bus interface 1130 is a part which connects the core unit 1110, the cache memory unit 1120 and external device and allows data to be efficiently transmitted.

The processor 1100 according to this implementation may include a plurality of core units 1110, and the plurality of core units 1110 may share the cache memory unit 1120. The plurality of core units 1110 and the cache memory unit 1120 may be directly connected or be connected through the bus interface 1130. The plurality of core units 1110 may be configured in the same way as the above-described configuration of the core unit 1110. In the case where the processor 1100 includes the plurality of core unit 1110, the primary storage section 1121 of the cache memory unit 1120 may be configured in each core unit 1110 in correspondence to the number of the plurality of core units 1110, and the secondary storage section 1122 and the tertiary storage section 1123 may be configured outside the plurality of core units 1110 in such a way as to be shared through the bus interface 1130. The processing speed of the primary storage section 1121 may be larger than the processing speeds of the secondary and tertiary storage section 1122 and 1123. In another implementation, the primary storage section 1121 and the secondary storage section 1122 may be configured in each core unit 1110 in correspondence to the number of the plurality of core units 1110, and the tertiary storage section 1123 may be configured outside the plurality of core units 1110 in such a way as to be shared through the bus interface 1130.

The processor 1100 according to this implementation may further include an embedded memory unit 1140 which stores data, a communication module unit 1150 which can transmit and receive data to and from an external device in a wired or wireless manner, a memory control unit 1160 which drives an external memory device, and a media processing unit 1170 which processes the data processed in the processor 1100 or the data inputted from an external input device and outputs the processed data to an external interface device and so on. Besides, the processor 1100 may include a plurality of various modules and devices. In this case, the plurality of modules which are added may exchange data with the core units 1110 and the cache memory unit 1120 and with one another, through the bus interface 1130.

The embedded memory unit 1140 may include not only a volatile memory but also a nonvolatile memory. The volatile memory may include a DRAM (dynamic random access memory), a mobile DRAM, an SRAM (static random access memory), and a memory with similar functions to above mentioned memories, and so on. The nonvolatile memory may include a ROM (read only memory), a NOR flash memory, a NAND flash memory, a phase change random access memory (PRAM), a resistive random access memory (RRAM), a spin transfer torque random access memory (STTRAM), a magnetic random access memory (MRAM), a memory with similar functions.

The communication module unit 1150 may include a module capable of being connected with a wired network, a module capable of being connected with a wireless network and both of them. The wired network module may include a local area network (LAN), a universal serial bus (USB), an Ethernet, power line communication (PLC) such as various devices which send and receive data through transmit lines, and so on. The wireless network module may include Infrared Data Association (IrDA), code division multiple access (CDMA), time division multiple access (TDMA), frequency division multiple access (FDMA), a wireless LAN, Zigbee, a ubiquitous sensor network (USN), Bluetooth, radio frequency identification (RFID), long term evolution (LTE), near field communication (NFC), a wireless broadband Internet (Wibro), high speed downlink packet access (HSDPA), wideband CDMA (WCDMA), ultra wideband (UWB) such as various devices which send and receive data without transmit lines, and so on.

The memory control unit 1160 is to administrate and process data transmitted between the processor 1100 and an external storage device operating according to a different communication standard. The memory control unit 1160 may include various memory controllers, for example, devices which may control IDE (Integrated Device Electronics), SATA (Serial Advanced Technology Attachment), SCSI (Small Computer System Interface), RAID (Redundant Array of Independent Disks), an SSD (solid state disk), eSATA (External SATA), PCMCIA (Personal Computer Memory Card International Association), a USB (universal serial bus), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The media processing unit 1170 may process the data processed in the processor 1100 or the data inputted in the forms of image, voice and others from the external input device and output the data to the external interface device. The media processing unit 1170 may include a graphic processing unit (GPU), a digital signal processor (DSP), a high definition audio device (HD audio), a high definition multimedia interface (HDMI) controller, and so on.

Figure 7:
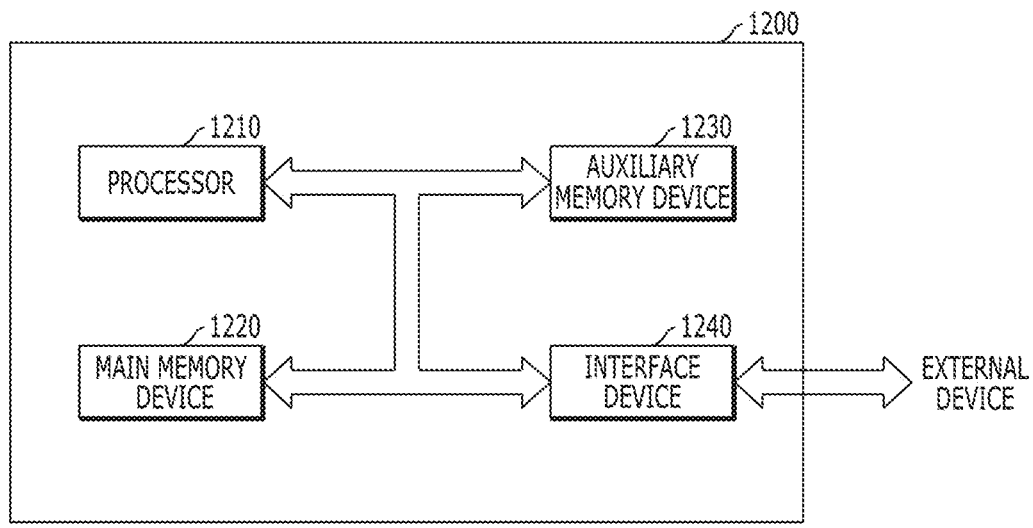
FIG. 7 is an example of configuration diagram of a system implementing memory circuitry based an implementation of the disclosed technology.

FIG. 7 is an example of configuration diagram of a system implementing memory circuitry based on an implementation of the disclosed technology.

Referring to FIG. 7, a system 1200 as an apparatus for processing data may perform input, processing, output, communication, storage, etc. to conduct a series of manipulations for data. The system 1200 may include a processor 1210, a main memory device 1220, an auxiliary memory device 1230, an interface device 1240, and so on. The system 1200 of this implementation may be various electronic systems which operate using processors, such as a computer, a server, a PDA (personal digital assistant), a portable computer, a web tablet, a wireless phone, a mobile phone, a smart phone, a digital music player, a PMP (portable multimedia player), a camera, a global positioning system (GPS), a video camera, a voice recorder, a telematics, an audio visual (AV) system, a smart television, and so on.

The processor 1210 may decode inputted commands and processes operation, comparison, etc. for the data stored in the system 1200, and controls these operations. The processor 1210 may include a microprocessor unit (MPU), a central processing unit (CPU), a single/multi-core processor, a graphic processing unit (GPU), an application processor (AP), a digital signal processor (DSP), and so on.

The main memory device 1220 is a storage which can temporarily store, call and execute program codes or data from the auxiliary memory device 1230 when programs are executed and can conserve memorized contents even when power supply is cut off. The main memory device 1220 may include one or more of the above-described semiconductor devices in accordance with the implementations. For example, the main memory device 1220 may include a free layer having a variable magnetization direction; a pinned layer having a fixed magnetization direction; and a tunnel barrier layer interposed between the free layer and the pinned layer, wherein the free layer may include: a first sublayer having a damping constant of 0.1 or less; a second sublayer having a perpendicular magnetic anisotropy energy density ranging from $1.0 \times 10^4$ to $1.0 \times 10^8$ erg/cm$^3$; and an insertion layer interposed between the first sublayer and the second sublayer. Through this, data storage characteristics of the main memory device 1220 may be improved. As a consequence, operating characteristics of the system 1200 may be improved.

Also, the main memory device 1220 may further include a static random access memory (SRAM), a dynamic random access memory (DRAM), and so on, of a volatile memory type in which all contents are erased when power supply is cut off. Unlike this, the main memory device 1220 may not include the semiconductor devices according to the implementations, but may include a static random access memory (SRAM), a dynamic random access memory (DRAM), and so on, of a volatile memory type in which all contents are erased when power supply is cut off.

The auxiliary memory device 1230 is a memory device for storing program codes or data. While the speed of the auxiliary memory device 1230 is slower than the main memory device 1220, the auxiliary memory device 1230 can store a larger amount of data. The auxiliary memory device 1230 may include one or more of the above-described semiconductor devices in accordance with the implementations. For example, the auxiliary memory device 1230 may include a free layer having a variable magnetization direction; a pinned layer having a fixed magnetization direction; and a tunnel barrier layer interposed between the free layer and the pinned layer, wherein the free layer may include: a first sublayer having a damping constant of 0.1 or less; a second sublayer having a perpendicular magnetic anisotropy energy density ranging from $1.0 \times 10^4$ to $1.0 \times 10^8$ erg/cm$^3$; and an insertion layer interposed between the first sublayer and the second sublayer. Through this, data storage characteristics of the auxiliary memory device 1230 may be improved. As a consequence, operating characteristics of the system 1200 may be improved.

Also, the auxiliary memory device 1230 may further include a data storage system (see the reference numeral 1300 of FIG. 8) such as a magnetic tape using magnetism, a magnetic disk, a laser disk using optics, a magneto-optical disc using both magnetism and optics, a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on. Unlike this, the auxiliary memory device 1230 may not include the semiconductor devices according to the implementations, but may include data storage systems (see the reference numeral 1300 of FIG. 8) such as a magnetic tape using magnetism, a magnetic disk, a laser disk using optics, a magneto-optical disc using both magnetism and optics, a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The interface device 1240 may be to perform exchange of commands and data between the system 1200 of this implementation and an external device. The interface device 1240 may be a keypad, a keyboard, a mouse, a speaker, a mike, a display, various human interface devices (HIDs), a communication device, and so on. The communication device may include a module capable of being connected with a wired network, a module capable of being connected with a wireless network and both of them. The wired network module may include a local area network (LAN), a universal serial bus (USB), an Ethernet, power line communication (PLC), such as various devices which send and receive data through transmit lines, and so on. The wireless network module may include Infrared Data Association (IrDA), code division multiple access (CDMA), time division multiple access (TDMA), frequency division multiple access (FDMA), a wireless LAN, Zigbee, a ubiquitous sensor network (USN), Bluetooth, radio frequency identification (RFID), long term evolution (LTE), near field communication (NFC), a wireless broadband Internet (Wibro), high speed downlink packet access (HSDPA), wideband CDMA (WCDMA), ultra wideband (UWB), such as various devices which send and receive data without transmit lines, and so on.

Figure 8:
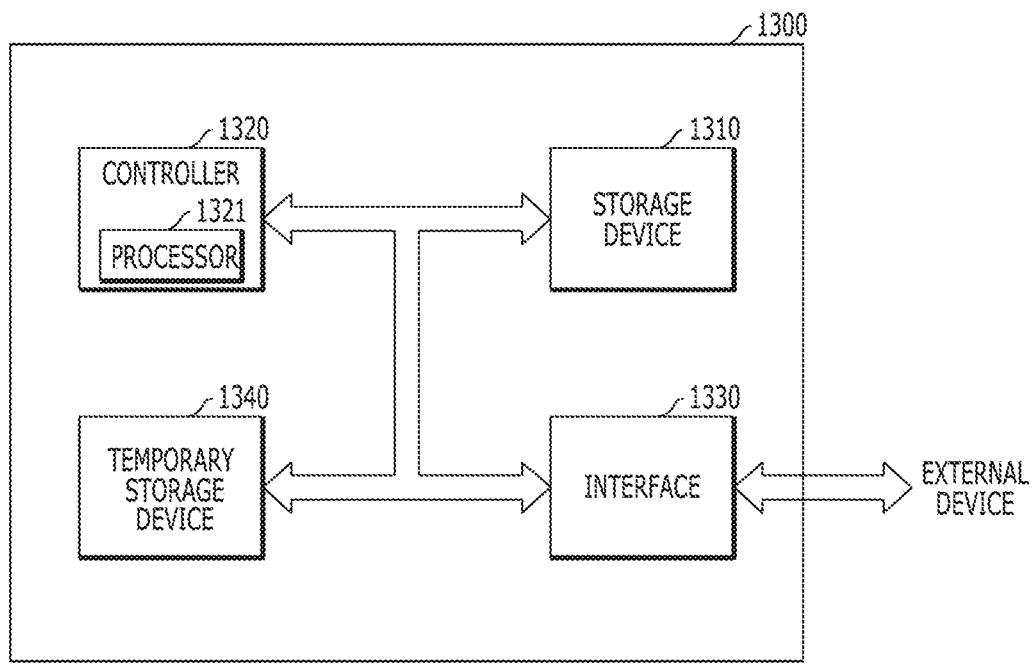
FIG. 8 is an example of configuration diagram of a data storage system implementing memory circuitry based on an implementation of the disclosed technology.

FIG. 8 is an example of configuration diagram of a data storage system implementing memory circuitry based on an implementation of the disclosed technology.

Referring to FIG. 8, a data storage system 1300 may include a storage device 1310 which has a nonvolatile characteristic as a component for storing data, a controller 1320 which controls the storage device 1310, an interface 1330 for connection with an external device, and a temporary storage device 1340 for storing data temporarily. The data storage system 1300 may be a disk type such as a hard disk drive (HDD), a compact disc read only memory (CDROM), a digital versatile disc (DVD), a solid state disk (SSD), and so on, and a card type such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The storage device 1310 may include a nonvolatile memory which stores data semi-permanently. The nonvolatile memory may include a ROM (read only memory), a NOR flash memory, a NAND flash memory, a phase change random access memory (PRAM), a resistive random access memory (RRAM), a magnetic random access memory (MRAM), and so on.

The controller 1320 may control exchange of data between the storage device 1310 and the interface 1330. To this end, the controller 1320 may include a processor 1321 for performing an operation for, processing commands inputted through the interface 1330 from an outside of the data storage system 1300 and so on.

The interface 1330 is to perform exchange of commands and data between the data storage system 1300 and the external device. In the case where the data storage system 1300 is a card type, the interface 1330 may be compatible with interfaces which are used in devices, such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on, or be compatible with interfaces which are used in devices similar to the above mentioned devices. In the case where the data storage system 1300 is a disk type, the interface 1330 may be compatible with interfaces, such as IDE (Integrated Device Electronics), SATA (Serial Advanced Technology Attachment), SCSI (Small Computer System Interface), eSATA (External SATA), PCMCIA (Personal Computer Memory Card International Association), a USB (universal serial bus), and so on, or be compatible with the interfaces which are similar to the above mentioned interfaces. The interface 1330 may be compatible with one or more interfaces having a different type from each other.

The temporary storage device 1340 can store data temporarily for efficiently transferring data between the interface 1330 and the storage device 1310 according to diversifications and high performance of an interface with an external device, a controller and a system. The temporary storage device 1340 for temporarily storing data may include one or more of the above-described semiconductor devices in accordance with the implementations. The temporary storage device 1340 may include a free layer having a variable magnetization direction; a pinned layer having a fixed magnetization direction; and a tunnel barrier layer interposed between the free layer and the pinned layer, wherein the free layer may include: a first sublayer having a damping constant of 0.1 or less; a second sublayer having a perpendicular magnetic anisotropy energy density ranging from $1.0 \times 10^4$ to $1.0 \times 10^8$ erg/cm$^3$; and an insertion layer interposed between the first sublayer and the second sublayer. Through this, data storage characteristics of the storage device 1310 or the temporary storage device 1340 may be improved. As a consequence, operating characteristics and data storage characteristics of the data storage system 1300 may be improved.

Figure 9:
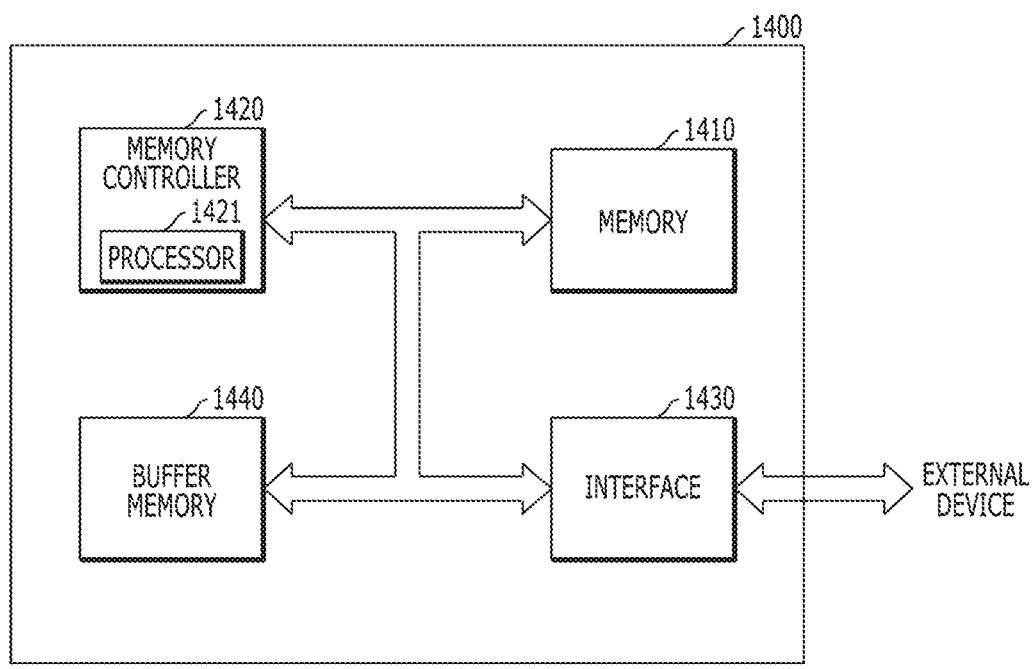
FIG. 9 is an example of configuration diagram of a memory system implementing memory circuitry based on an implementation of the disclosed technology.

FIG. 9 is an example of configuration diagram of a memory system implementing memory circuitry based on an implementation of the disclosed technology.

Referring to FIG. 9, a memory system 1400 may include a memory 1410 which has a nonvolatile characteristic as a component for storing data, a memory controller 1420 which controls the memory 1410, an interface 1430 for connection with an external device, and so on. The memory system 1400 may be a card type such as a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The memory 1410 for storing data may include one or more of the above-described semiconductor devices in accordance with the implementations. For example, the memory 1410 may include may include a free layer having a variable magnetization direction; a pinned layer having a fixed magnetization direction; and a tunnel barrier layer interposed between the free layer and the pinned layer, wherein the free layer may include: a first sublayer having a damping constant of 0.1 or less; a second sublayer having a perpendicular magnetic anisotropy energy density ranging from $1.0 \times 10^4$ to $1.0 \times 10^8$ erg/cm$^3$; and an insertion layer interposed between the first sublayer and the second sublayer. Through this, data storage characteristics of the memory 1410 may be improved. As a consequence, operating characteristics and data storage characteristics of the memory system 1400 may be improved.

Also, the memory 1410 according to this implementation may further include a ROM (read only memory), a NOR flash memory, a NAND flash memory, a phase change random access memory (PRAM), a resistive random access memory (RRAM), a magnetic random access memory (MRAM), and so on, which have a nonvolatile characteristic.

The memory controller 1420 may control exchange of data between the memory 1410 and the interface 1430. To this end, the memory controller 1420 may include a processor 1421 for performing an operation for and processing commands inputted through the interface 1430 from an outside of the memory system 1400.

The interface 1430 is to perform exchange of commands and data between the memory system 1400 and the external device. The interface 1430 may be compatible with interfaces which are used in devices, such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on, or be compatible with interfaces which are used in devices similar to the above mentioned devices. The interface 1430 may be compatible with one or more interfaces having a different type from each other.

The memory system 1400 according to this implementation may further include a buffer memory 1440 for efficiently transferring data between the interface 1430 and the memory 1410 according to diversification and high performance of an interface with an external device, a memory controller and a memory system. For example, the buffer memory 1440 for temporarily storing data may include one or more of the above-described semiconductor devices in accordance with the implementations. The buffer memory 1440 may include may include a free layer having a variable magnetization direction; a pinned layer having a fixed magnetization direction; and a tunnel barrier layer interposed between the free layer and the pinned layer, wherein the free layer may include: a first sublayer having a damping constant of 0.1 or less; a second sublayer having a perpendicular magnetic anisotropy energy density ranging from $1.0 \times 10^4$ to $1.0 \times 10^8$ erg/cm$^3$; and an insertion layer interposed between the first sublayer and the second sublayer. Through this, data storage characteristics of the buffer memory 1440 may be improved. As a consequence, operating characteristics and data storage characteristics of the memory system 1400 may be improved.

Moreover, the buffer memory 1440 according to this implementation may further include an SRAM (static random access memory), a DRAM (dynamic random access memory), and so on, which have a volatile characteristic, and a phase change random access memory (PRAM), a resistive random access memory (RRAM), a spin transfer torque random access memory (STTRAM), a magnetic random access memory (MRAM), and so on, which have a nonvolatile characteristic. Unlike this, the buffer memory 1440 may not include the semiconductor devices according to the implementations, but may include an SRAM (static random access memory), a DRAM (dynamic random access memory), and so on, which have a volatile characteristic, and a phase change random access memory (PRAM), a resistive random access memory (RRAM), a spin transfer torque random access memory (STTRAM), a magnetic random access memory (MRAM), and so on, which have a nonvolatile characteristic.

Features in the above examples of electronic devices or systems in FIGS. 5-9 based on the memory devices disclosed in this document may be implemented in various devices, systems or applications. Some examples include mobile phones or other portable communication devices, tablet computers, notebook or laptop computers, game machines, smart TV sets, TV set top boxes, multimedia servers, digital cameras with or without wireless communication functions, wrist watches or other wearable devices with wireless communication capabilities.

While this patent document contains many specifics, these should not be construed as limitations on the scope of any invention or of what may be claimed, but rather as descriptions of features that may be specific to particular embodiments of particular inventions. Certain features that are described in this patent document in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. Moreover, the separation of various system components in the embodiments described in this patent document should not be understood as requiring such separation in all embodiments.

Only a few implementations and examples are described. Other implementations, enhancements and variations can be made based on what is described and illustrated in this patent document.

What is claimed is:

1. An electronic device comprising a semiconductor memory, wherein the semiconductor memory includes:
   a free layer having a variable magnetization direction;
   a pinned layer having a fixed magnetization direction; and
   a tunnel barrier layer interposed between the free layer and the pinned layer,
   wherein the free layer includes:
   a first sublayer having a damping constant of 0.1 or less;
   a second sublayer having a perpendicular magnetic anisotropy energy density ranging from $1.0 \times 10^4$ to $1.0 \times 10^8$ erg/cm$^3$; and
   an insertion layer interposed between the first sublayer and the second sublayer.

2. The electronic device of claim 1, wherein the second sublayer is disposed closer to the tunnel barrier layer than the first sublayer is.

3. The electronic device of claim 1, wherein the first sublayer includes a Heusler alloy, a half-Heusler alloy, or a half-metal, or a combination thereof.

4. The electronic device of claim 1, wherein the insertion layer includes a material blocking crystallinity that is transferred from a layer disposed below the insertion layer.

5. The electronic device of claim 4, wherein the insertion layer includes Zr, Hf, V, Cr, Cu, Nb, Mo, Ru, Rh, Ta, W, Re or Ir, or a combination thereof.

6. The electronic device of claim 1, wherein the second sublayer includes an alloy or a stack structure, which includes Co, Fe or B, or a combination thereof.

7. The electronic device of claim 6, wherein the second sublayer includes a Co—Fe—B alloy or a Co—Fe—B—X alloy (where X may be Mn, Cu, Al, Si, Ti, V, Cr, Ni, Ga, Ge, Zr, Nb, Mo, Pd, Ag, Hf, Ta, W or Pt).

8. The electronic device of claim 1, wherein the first sublayer has a damping constant ranging from 0.001 to 0.1.

9. The electronic device according to claim 1, further comprising a microprocessor which includes:
a control unit configured to receive a signal including a command from an outside of the microprocessor, and performs extracting, decoding of the command, or controlling input or output of a signal of the microprocessor;
an operation unit configured to perform an operation based on a result that the control unit decodes the command; and
a memory unit configured to store data for performing the operation, data corresponding to a result of performing the operation, or an address of data for which the operation is performed,
wherein the semiconductor memory is part of the memory unit in the microprocessor.

10. The electronic device according to claim 1, further comprising a processor which includes:
a core unit configured to perform, based on a command inputted from an outside of the processor, an operation corresponding to the command, by using data;
a cache memory unit configured to store data for performing the operation, data corresponding to a result of performing the operation, or an address of data for which the operation is performed; and
a bus interface connected between the core unit and the cache memory unit, and configured to transmit data between the core unit and the cache memory unit,
wherein the semiconductor memory is part of the cache memory unit in the processor.

11. The electronic device according to claim 1, further comprising a processing system which includes:
a processor configured to decode a command received by the processor and control an operation for information based on a result of decoding the command;
an auxiliary memory device configured to store a program for decoding the command and the information;
a main memory device configured to call and store the program and the information from the auxiliary memory device such that the processor can perform the operation using the program and the information when executing the program; and
an interface device configured to perform communication between at least one of the processor, the auxiliary memory device and the main memory device and the outside,
wherein the semiconductor memory is part of the auxiliary memory device or the main memory device in the processing system.

12. The electronic device according to claim 1, further comprising a data storage system which includes:
a storage device configured to store data and conserve stored data regardless of power supply;
a controller configured to control input and output of data to and from the storage device according to a command inputted from an outside;
a temporary storage device configured to temporarily store data exchanged between the storage device and the outside; and
an interface configured to perform communication between at least one of the storage device, the controller and the temporary storage device and the outside,
wherein the semiconductor memory is part of the storage device or the temporary storage device in the data storage system.

13. The electronic device according to claim 1, further comprising a memory system which includes:
a memory configured to store data and conserve stored data regardless of power supply;
a memory controller configured to control input and output of data to and from the memory according to a command inputted from an outside;
a buffer memory configured to buffer data exchanged between the memory and the outside; and
an interface configured to perform communication between at least one of the memory, the memory controller and the buffer memory and the outside,
wherein the semiconductor memory is part of the memory or the buffer memory in the memory system.

14. An electronic device comprising a semiconductor memory, wherein the semiconductor memory includes a variable resistance element,
wherein the variable resistance element includes:
a free layer having a variable magnetization direction;
a pinned layer having a fixed magnetization direction; and
a tunnel barrier layer interposed between the free layer and the pinned layer,
wherein the free layer includes:
a first sublayer including a Heusler alloy, a half-Heusler alloy, or a half-metal, or a combination thereof;
a second sublayer including an alloy or a stack structure which includes Co, Fe or B, or a combination thereof; and
an insertion layer interposed between the first sublayer and the second sublayer.

15. The electronic device of claim 14, wherein the first sublayer is structured to decrease a damping constant of the free layer.

16. The electronic device of claim 14, wherein the second sublayer is structured to maintain a perpendicular magnetic anisotropy energy density of the free layer at a high level.

17. The electronic device of claim 14, wherein the insertion layer includes a material blocking crystallinity that is transferred from a layer disposed below the insertion layer.

18. The electronic device of claim 17, wherein the insertion layer includes Zr, Hf, V, Cr, Cu, Nb, Mo, Ru, Rh, Ta, W, Re or Ir, or a combination thereof.

19. The electronic device of claim 14, wherein the second sublayer includes a Co—Fe—B alloy or a Co—Fe—B—X alloy (where, X may be Mn, Cu, Al, Si, Ti, V, Cr, Ni, Ga, Ge, Zr, Nb, Mo, Pd, Ag, Hf, Ta, W or Pt).

20. The electronic device of claim 14, wherein the first sublayer has a damping constant ranging from 0.001 to 0.1.

* * * * *